United States Patent
Shepherd

(10) Patent No.: US 6,472,599 B2
(45) Date of Patent: Oct. 29, 2002

(54) ARRANGEMENT FOR SUPPLYING POWER FROM A BUSS BAR TO A CIRCUIT BOARD

(75) Inventor: Barry Lee Shepherd, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/779,598

(22) Filed: Feb. 9, 2001

(65) Prior Publication Data

US 2001/0023144 A1 Sep. 20, 2001

Related U.S. Application Data

(63) Continuation of application No. 09/149,145, filed on Sep. 8, 1998, now Pat. No. 6,255,588.

(51) Int. Cl.[7] .................................................. H02G 3/00
(52) U.S. Cl. ........................................ 174/72 B; 439/840
(58) Field of Search ................................ 439/816, 840, 439/569; 174/72 B, 62 B, 68.2, 70 B, 88 B; 361/775, 785

(56) References Cited

U.S. PATENT DOCUMENTS

| | | | |
|---|---|---|---|
| 3,157,735 A | * 11/1964 | Stroup et al. | |
| 3,533,044 A | * 10/1970 | Baumen | |
| 3,795,884 A | * 3/1974 | Katoka | |
| 3,881,799 A | * 5/1975 | Elliott et al. | |
| 4,083,622 A | * 4/1978 | Neidecker | |
| 4,199,637 A | * 4/1980 | Sado | |
| 4,462,657 A | * 7/1984 | Snowdon et al. | |
| 4,529,257 A | * 7/1985 | Goodman et al. | |
| 4,694,123 A | * 9/1987 | Massey | 174/72 B |
| 4,755,145 A | * 7/1988 | Johnson et al. | |
| 4,810,213 A | * 3/1989 | Chabot | 439/840 |
| 4,814,040 A | * 3/1989 | Ozawa | 156/634 |
| 4,836,791 A | * 6/1989 | Grabbe | 439/79 |
| 4,869,676 A | * 9/1989 | Demler, Jr. | |
| 5,061,191 A | * 10/1991 | Casciotti et al. | 439/66 |
| 5,104,324 A | * 4/1992 | Grabbe et al. | 439/62 |
| 5,139,426 A | * 8/1992 | Barkus et al. | 439/65 |
| 5,166,867 A | * 11/1992 | Seyama et al. | 174/72 B |
| 5,632,629 A | * 5/1997 | Legrady | |
| 5,720,622 A | * 2/1998 | Ishikawa et al. | 439/86 |

OTHER PUBLICATIONS

Research Disclosure, No. 32567, Kenneth Mason Publications, England May 1999.*
1 Sheet of Drawing, sent to vender on Nov. 21, 1996.

* cited by examiner

Primary Examiner—Neil Abrams
(74) Attorney, Agent, or Firm—Robert H. Berdo, Jr.

(57) ABSTRACT

An electrical interface arrangement includes a buss bar having a longitudinal edge that is substantially smooth and free of conductive tabs. A conductive member is arranged adjacent to the longitudinal edge of the buss bar, and contacts the buss bar with at least 40 A-spots per inch, along substantially an entire length of the buss bar. A circuit board having a plurality of internal planes is provided, with at least one of the internal planes being an internal power plane, and with at least another one of the internal planes being an internal wiring plane having a plurality of conductive wirings. The circuit board further has an arrangement for electrically connecting the conductive member to the internal power plane without interfering with a placement of the conductive wirings, so that the circuit board and the buss bar are in electrical communication.

24 Claims, 11 Drawing Sheets

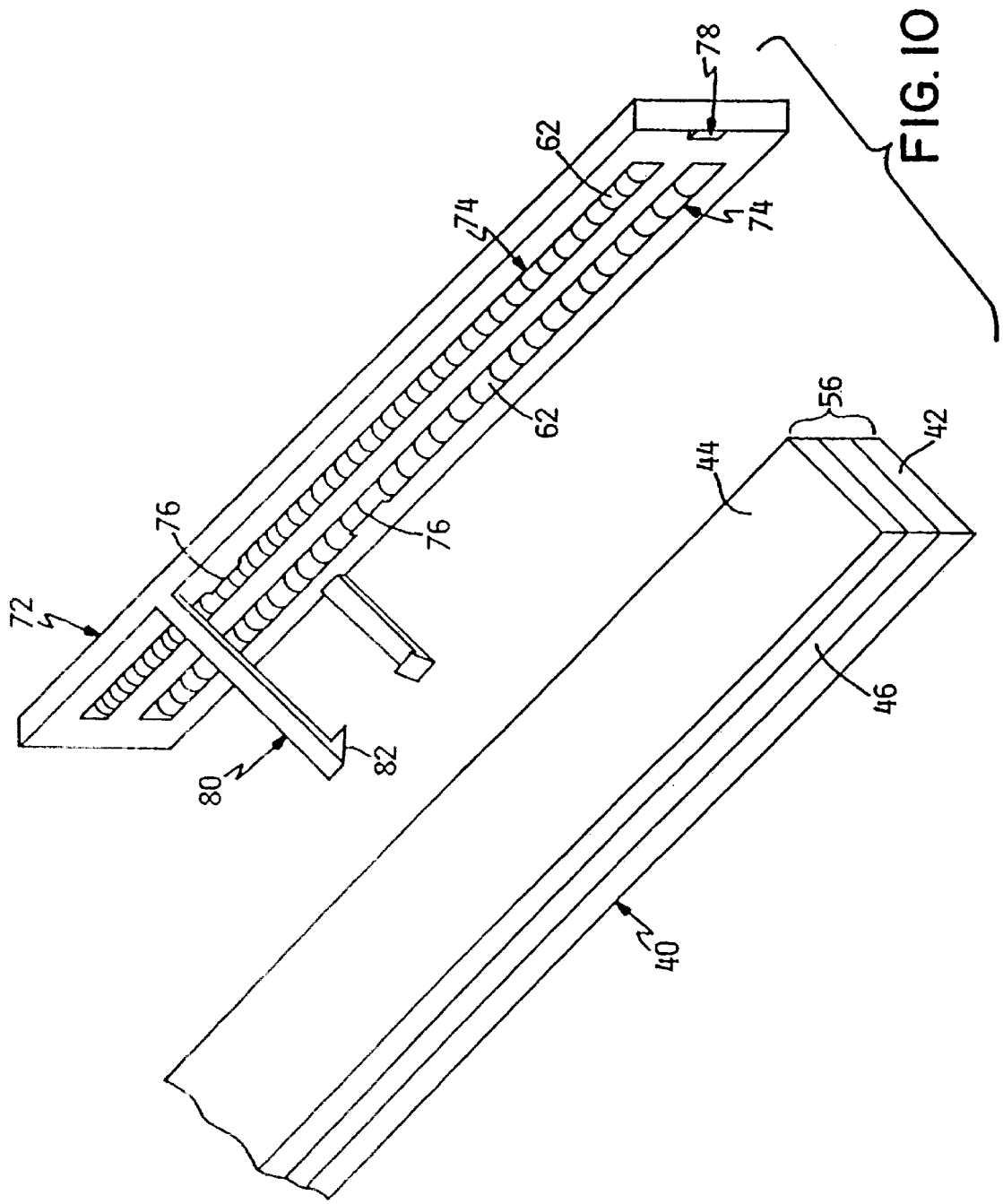

ARRANGEMENT FOR SUPPLYING POWER FROM A BUSS BAR TO A CIRCUIT BOARD

This is a Continuation of prior application Ser. No. 09/149,145, filed on Sep. 8, 1998, now U.S. Pat. No. 6,255,588.

BACKGROUND OF THE INVENTION

1. Field of the Invention

The present invention relates to an enhanced arrangement for supplying power to a circuit board, and in particular, to an enhanced arrangement for supplying power to a backplane of a computer using a buss bar.

2. Background Information

Backplanes are wiring boards used, for example, in computers, and are typically provided with card slots or plugs for receiving various circuit boards, such as a processor card and a so-called memory riser card, attached to a common surface of the backplane by way of the card slots or the plugs. Further, it is typical to permanently attach a clock card, which is a further type of circuit board, and various electrical components, to the backplane. This assembly of the backplane, electrical components, and circuit boards may be positioned within an open cage, which is a frame fixed within a computer housing. The cage serves to position the circuit boards within the computer housing.

The various electrical components located on the backplane and cards (for example, the Dual In-Line Memory Modules (DIMMs) on the memory riser card) tend to consume a substantial amount of electrical power. In order to supply the electrical components with power, it is conventional to electrically connect the backplane to an external power supply. The backplane distributes the power received from the external power supply to the appropriate electrical components in a manner which will be subsequently described.

Backplanes are conventionally comprised of a plurality of superposed, laminated and alternating layers of conductive and insulative materials. The layers are each formed in discrete planes. For example, and referring to FIG. 1, a typical backplane 8 may have one or more internal wiring planes (i.e., a set of wirings located in one plane), each of which includes a number of individual conductive wirings 10 (also known as "traces"). The wirings are used to interconnect various electrical components and/or cards (not shown) locatable on the backplane 8 together, and allow the transmission of electrical signals.

Further, the backplane 8 will also typically include one or more power planes 12, which are typically sheets of conductive material, such as copper. The power planes are used to supply power from the backplane 8 to the various electrical components and/or cards located on the backplane 8.

Each of the conductive layers of backplane 8 are separated from the other conductive layers by a respective layer of insulating material. In FIG. 1, the power plane 12 is located beneath the plane of conductive wirings 10. Only a portion of the power plane 12 and conductive wirings 10 is shown for clarity of illustration.

Typically, the backplane 8 will be provided with a number of plated vias 14, 16 (i.e., holes plated or filled with a conductive material). Each via is electrically coupled to a respective internal power plane 12 or a respective wiring 10. The power is typically transmitted within the backplane 8, through the plating of the vias 14, through the respective internal power plane 12, and to the associated electrical components and/or cards. Likewise, the electrical signals are transmitted through the plating of the respective vias 16, through the respective wirings 10, and to an associated electrical component and/or card. As will be appreciated, to prevent shorting, it is important that the respective vias are only coupled to their associated corresponding wiring or power plane.

Further, in order to connect the backplane 8 to the external power supply, it is conventional to utilize a buss bar 18 (also known as a busbar or bus), such as is shown in FIG. 2. A buss bar is typically a heavy, rigid, metallic conductor, used to carry a large current and/or to make a common connection between several circuits. In the computer field, the buss bar is conventionally a relatively large, rectangular-shaped plate, composed of two conductive layers 20, 22 separated by a dielectric layer 24, for example. The conductive layers 20, 22 can be copper, with one of the conductive layers 20 being used to transmit power from an external power supply 25 to the backplane 8, and the other of the conductive layers 22 serving as a ground for the backplane. The advantages of a buss bar, as opposed to using a number of individual power transmission wires, each of which would be connected to the external power supply 25 and to a respective electrical connector, are well known to those skilled in the art. Such advantages include, for example, an organized power transmission scheme, due to the elimination of the power transmission wires, and a reduction in undesirable electrical noise, which may be generated when using a number of individual power transmission wires.

Typically, one edge of the buss bar 18 is provided with a plurality, for example, five sets, of conductive tabs 26, 26', each of which plugs into a corresponding electrical connector 28 that is connectable to the back plane 8. Various views of a conventional electrical connector 28 are shown in FIGS. 3–6 These electrical connectors 28 can be so-called solder tail power receptacles, (as illustrated) or C/P(compliant pin) power receptacles, for example, and will typically be provided with a plurality of pins 30. The pins 30 are arranged to be in registration with, and insertable into, a corresponding number of the plated vias 14 formed in the backplane 8.

Once the buss bar 18 is connected to the power supply 25 (in any conventional manner), and connected to the respective electrical connectors 28, the power will be transmitted through the conductive layer 20 of the buss bar 18, through the respective conductive tabs 26 of the buss bar, through the respective electrical connectors 28, and into the corresponding vias 14. Thereafter, the power is transmitted to the associated electrical components and/or cards in the manner previously described. To complete the circuit, the current travels back through a so-called ground plane, through the respective electrical connectors 28, through the respective conductive tabs 26' of the buss bar, and back to the negative terminal of the power supply 25, for example.

As will be appreciated, the use of power receptacles 28 requires that the associated vias 14 be positioned with predetermined spacings, so as to accommodate the pins 30 of the power receptacles. For example, if a power receptacle 28 has five pins 30 arranged in sequence, then there must be five vias 14 arranged in the same sequence, and with the same spacing, as the pins. Further, since the buss bar 18 will often have a plurality of sets of conductive tabs 26, 26', for example, five sets of conductive tabs, linearly arranged along its edge, then there will typically be a like-number of power receptacles 28 arranged in a similar manner, so as to receive the respective conductive tabs therein. This will require a proportional number of vias 14 to be prearranged in the backplane 8, to accommodate the respective pins 30 of the respective power receptacles 28.

This arrangement of the vias 14 may disadvantageously interfere with the placement of the various wirings 10 formed on or in the backplane 8. For example, if a via 14 is placed in the path of a wiring 10, then the wiring 10 may need to be diverted around the via 14 to ensure its continuity. Stated alternatively, the positioning of the tabs 26, 26' on the buss bar 18 will dictate where the vias 14 are located, and the positioning of the vias 14 will control the arrangement of the various wirings 10 on the backplane 8. However, this may entail additional costs in planning and designing the layout of the backplane 8, and require additional steps during the manufacturing of the backplane to ensure that the wirings 10 avoid the vias 14. Further, in order to avoid the placement of the vias 14, wirings 10 may be required to have added lengths with a resulting increase in resistance and decrease in performance. As will be appreciated, wirings having a short length are preferred in computer applications, due to the shorter distance required for electrical signals to travel. Moreover, since relatively low currents are transmitted to the associated circuitry through the wirings 10, the voltage drop due to the resistance of the wirings 10 preferably should be kept small. A low resistance will result in a relatively low voltage drop. Alternatively, if a via cannot be easily avoided, even by increasing a length of the wirings 10, it may be necessary to add further wiring planes, which likewise increases the cost (and thickness) of the backplane. Thus, there is a need for a means for transmitting the electrical current from a power source to a backplane that will not interfere with the placement of the wirings on the backplane.

Furthermore, this known arrangement requires that the power be channeled through the respective conductive tabs 26, 26', and into the respective power receptacles 28. However, the power receptacles 28 are limited in the amount of current that can be applied thereto. For example, conventional power receptacles have a 35–40 amp current limit. If more power is required, then a different system is needed for coupling the buss bar to the backplane. Thus, there is a need for a coupling arrangement that will electrically couple a buss bar to a backplane, which will allow for relatively high power transfers.

Additionally, the conventional connection between the buss bar and the backplane results in a relatively small number of so-called "A-spots". An A-spot is the points of contact between adjoining surfaces. Because all surfaces are defined (on a microscopic level) by a plurality of peaks and valleys, when two such surfaces are placed in contact with each other, the two surfaces will only be in contact with each other at the highest of the peaks. Further, it is generally assumed that only one A-spot can be ensured between any two adjoining surfaces, i.e., at the point where the highest peak on either of the two surfaces contacts the other surface. As will be appreciated, this point of contact is typically quite small, with the size of the A-spot being dependent on the hardness of the two contact materials, and the contact force between the two contact materials. As the hardness of the materials increases, the size of the A-spot will decrease. Inversely, as the contact force between the two contact materials increases, the size of the A-spot will increase.

Since current can only flow from one conductive material to another adjacent conductive material at the A-spots, it is apparent that a larger A-spot will advantageously have a lower resistance, thus allowing the current to pass from one material to another more freely. Similarly, increasing the number of A-spots between two conductors will effectively reduce the resistance therebetween, thus also allowing the current to pass more freely.

The conventional buss bar 18, having five sets of conductive tabs 26, 26', will have a limited number of A-spots when plugged into the corresponding power receptacles 28. This severely limits the amount of current that can be transferred to the backplane 8. Further, although the size of each of the individual A-spots can be increased by increasing a contact force between the conductive tabs 26, 26' of the buss bar 18 and the respective power receptacles 28, this may result in further complications. For example, each conductive tab 26, 26' could be fastened to a corresponding power receptacle 28 using screws. However, this would make connecting the buss bar 18 to the backplane 8 more complicated, thus increasing assembly costs. Further, such arrangement would not increase the number of A-spots, only their respective sizes. Alternatively, and as shown in FIGS. 4–6, it is also known to provide each of the power receptacles 28 with a number of protruding contact bands 32, each of which contacts a respective conductive tab 26, 26' of the buss bar 18. While this will increase the number of A-spots per power receptacle, this will also result in a more complex, and hence more expensive, power receptacle. Further, the number of protruding contact bands 32 that can be located within a receptacle 28 is limited. For example, the illustrated receptacle 28 has twenty-two contact bands 32. As such, with this receptacle 28, there will be only twenty-two guaranteed A-spots per conductive tab. Moreover, there will be no A-spots in the locations between adjacent conductive tabs 26, 26'. Thus, there is need for an arrangement that will dramatically increase the number of A-spots at the connection between a buss bar and a back plane, without increasing the complexity of assembly.

Additionally, a substantial amount of force may be required in order to plug the conductive tabs 26, 26' of the buss bar 18 into the corresponding power receptacles 28, for a variety of reasons. For example, in order to provide for a larger A-spot, the protruding contact bands 32 within the respective power receptacles 28 will typically be adapted to exert a substantial amount of force (known as a "mating force") against the respective conductive tab 26, 26'. However, this arrangement will prevent the conductive tabs 26, 26' from being easily inserted into the respective power receptacles 28, since during insertion, the conductive tabs 26, 26' must urge the protruding contact bands 32 out of their respective positions. Moreover, if all of the respective power receptacles 28 are not precisely aligned with the conductive tabs 26, 26' of the buss bar 18, this misalignment will prevent the buss bar from being easily connected to the power receptacles. Thus, excessive force may sometimes be needed in order to plug the backplane 8 into the power receptacles 28. However, this may damage the power receptacle 28, the connection between the power receptacles and the backplane 8, and/or the backplane itself. Thus, there is a need for an electrical interface between a buss bar and a backplane that will allow the backplane to be electrically connected to the buss bar using a minimal amount of insertion force.

Further, power is conventionally supplied to buss bar 18 by connecting one end of the buss bar to the power supply 25. As previously noted, the current from the power supply 25 then passes through the buss bar 18, and to the respective power receptacles 28 by way of the conductive tabs 26. However, each conductive tab 26 is spaced away from where the current enters and exits the buss bar 18 by a different distance than the other conductive tabs. For example, the first conductive tab, i.e., the one located closest to the end of the buss bar 18 that is connected to the power supply 25, is located a first distance away from the end of the buss bar, the second conductive tab is located a second distance away from the end of the buss bar, and so on. As is apparent, the first distance is less than the second distance, the second distance is less than a third distance, and so on. However, since resistance is determined in part by the length of the conductor the current must flow through, the resistance to the current increases from the first conductive tab to the next conductive tab, i.e., the resistance at the first conductive tab is less than the resistance at the second conductive tab, and so on. Thus, there is a current attenuation from one conductive tab 26 to the next. Therefore, providing the conductive tabs furthest away from the power supply 25 with the necessary amount of current, may require that the current rating of the conductive tab nearest the power source be exceeded. This, of course, is undesirable. Therefore, there is need for a connector interface between a backplane and a buss bar that will allow current to enter the backplane in a uniform manner.

SUMMARY OF THE INVENTION

It is, therefore, a principle object of this invention to provide an enhanced arrangement for supplying power to a circuit board.

It is another object of the invention to provide an enhanced arrangement for supplying power to a circuit board that solves the above mentioned problems.

These and other objects of the present invention are accomplished by the enhanced arrangement for supplying power to a circuit board disclosed herein.

According to one aspect of the invention, an electrical interface is provided that includes a buss bar having a longitudinal edge, and at least one conductive coil spring, for example, having at least about 40 coils per inch. The buss bar typically has at least one conductive layer for transmitting power to a backplane, and at least one conductive layer serving as a ground source for the backplane. However, according to an exemplary embodiment of the present invention, a further conductive layer can be provided. The further conductive layer can advantageously be used to supply a different voltage, for example, to a discrete component of the backplane.

According to another aspect of the present invention, the longitudinal edge of the buss bar will be substantially smooth and free of conventional conductive projecting plugs. By eliminating conductive plugs, the resulting arrangement will allow for a relatively high power transfer, as compared to the conventional buss bar and power receptacle arrangement.

According to another exemplary embodiment of the present invention, the buss bar will be provided with at least one conductive channel member provided in a region of its longitudinal edge. The channel member is preferably adapted to receive the spring. In order to retain the spring within the channel, the channel will preferably have a width that is less than an outer diameter of the spring. When the spring is received within the channel, the spring will be retained therein due to a frictional fit. This arrangement will advantageously ensure that the spring will be electrically connected to the buss bar by way of the channel, and cause the spring to bulge out of an open side of the channel. Thus, when the buss bar is positioned over the circuit board, the bulging of the spring will ensure that the spring will be electrically connected to the conductive pad along its entire length.

Preferably, the spring has between about 60 coils per inch and about 70 coils per inch. It is believed that this range of coils will provide for a sufficient number of A-spots, while still providing a spring that can be manufactured using conventional techniques, that can tolerate the current flowing therethrough, and that has sufficient strength to resist permanent distortion when used in the intended manner.

The coil spring is positionable adjacent to the longitudinal edge of the buss bar along substantially an entire length of the buss bar, so as to be electrically coupled to the buss bar. This arrangement will advantageously result in a large number of A-spots at the interface between the buss bar and the coil spring, thus allowing current to pass from the buss bar to the coil spring in an unrestricted manner.

Further, due to the relatively large number of coils per inch of the spring, and because the spring extends along the entire length of the buss bar, the current will advantageously enter the spring in a relatively uniform manner, i.e., without, or with a very low, voltage drop.

Advantageously, there are two springs arranged parallel to, and separated from each other, with the longitudinal edge of the buss bar being positionable adjacent to the springs. For example, the base of the buss bar can be located between the two springs, or directly on top of the two springs. This will allow each spring to be in contact with a respective conductive layers of the buss bar, i.e., a layer that is used to supply power, and a layer that is used as a ground.

According to a further exemplary embodiment of the present invention, a spring retaining device is provided. The spring retaining device is advantageously adapted to retain the spring in a desired position, for example, between the base of the buss bar and a surface of the backplane. This facilitates assembly of the arrangement, and correctly positions the spring relative to the buss bar.

Preferably, the spring is electrically coupled to a circuit board, for example, a backplane, so as to cause the circuit board and the buss bar to be in electrical communication. This will result in an arrangement that will dramatically increase the number of A-spots at the connection between the buss bar and the circuit board, without increasing the complexity of assembly. Further, since power receptacles are not needed, this arrangement will allow current to enter the backplane in a uniform manner. Additionally, because this arrangement eliminates the need for the buss bar to be plugged into a receptacle, insertion forces are eliminated (or at least significantly reduced), which will facilitate assembly, and prevent damage to the associated backplane.

Preferably, the circuit board has a plurality of internal planes, with at least one of the internal planes being an internal power plane, and with the spring being electrically coupled to the internal power plane. Further, another of the internal planes is an internal wiring plane having a plurality of conductive wirings. According to an exemplary embodiment of the present invention, the circuit board will have an arrangement for electrically connecting the spring to the internal power plane without interfering with a placement of the conductive wirings. For example, a plurality of conductive vias can be positioned to avoid, and in dependence on a predetermined location of, the conductive wirings. This arrangement will advantageously allow the conductive wirings to be located without regard to the placement of the conductive vias, so that the conductive wirings can be positioned in the most efficient manner. The conductive vias can then be located in a variety of free locations, without interfering with the placement of the conductive wirings.

Preferably, the circuit board, such as a backplane, will include a conductive pad formed on a surface of the backplane, and electrically coupled to the conductive vias.

This arrangement will provide a relatively large surface to which the spring, for example, can be electrically coupled to. Further, the conductive pad can be connected to the conductive vias even if they are positioned over a relatively large area, and in a seemingly random pattern.

The present invention is also directed toward a method of connecting a circuit board to a power source. The method includes forming a circuit board by providing a plurality of conductive wirings in a first common plane and superposed between two insulating layers. A conductive layer is located in a second common plane that is essentially parallel to the first common plane, and is separated from the layer of conductive wirings by one of the two insulating layers. A plurality of conductive vias are formed, each extending through the two insulating layers and being located between respective adjacent ones of the conductive wirings without interfering with a placement of the conductive wirings. Each of the conductive vias is in electrical communication with the conductive layer. The method further includes electrically coupling the conductive vias to a power source. This method provides for an interface between a backplane, for example, and a buss bar, which does not hinder the placement of the conductive wirings on the backplane. Further, the method ensures that the power is essentially uniformly transferred to the backplane.

BRIEF DESCRIPTION OF THE DRAWINGS

FIG. 10 is a perspective illustration of a conductive member retaining device, according to an exemplary embodiment of the present invention.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Figure 7:
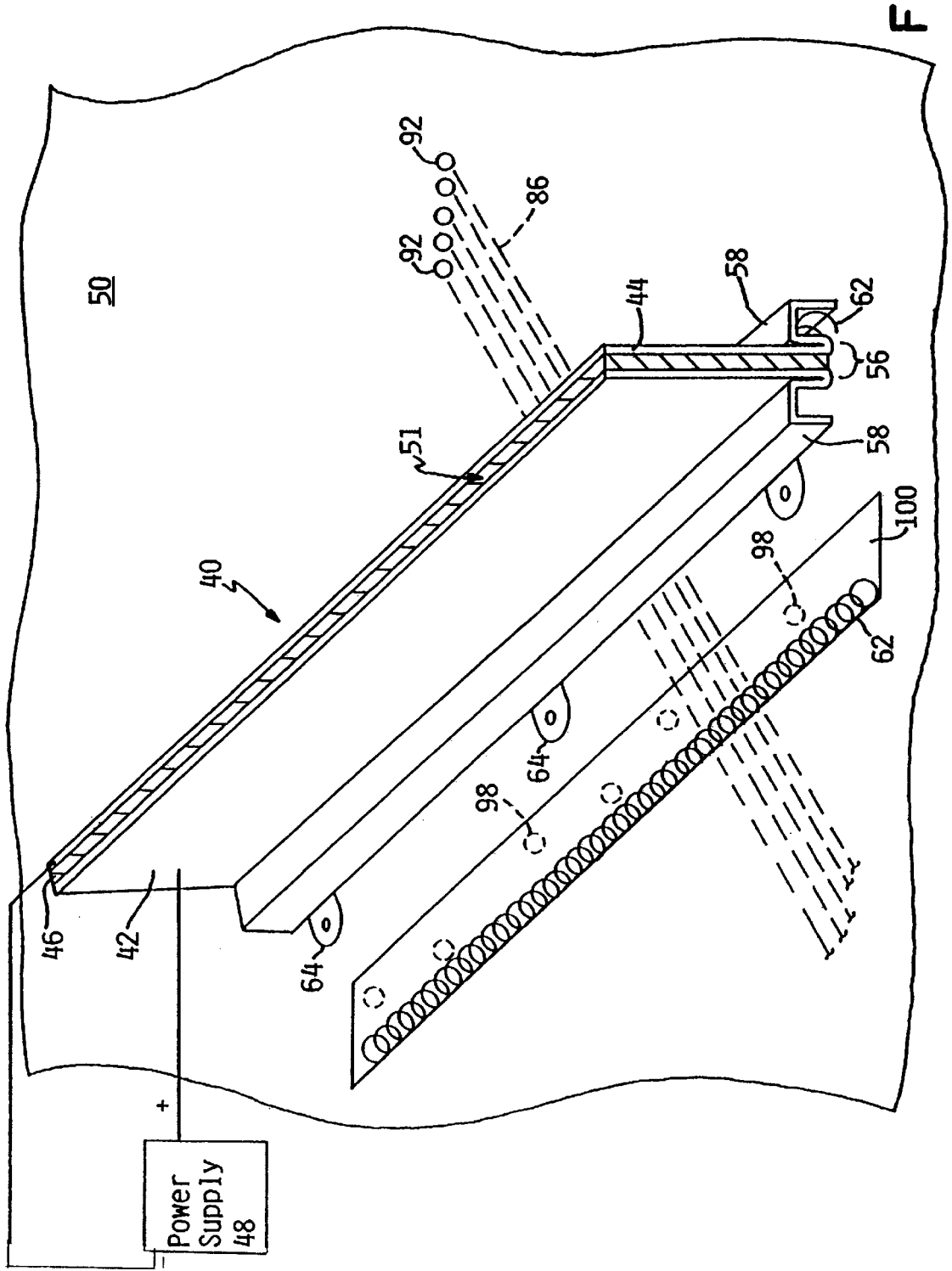
FIG. 7 is a perspective view of an exemplary embodiment of the present invention, with only a section of a circuit board being shown.

FIG. 7 illustrates an exemplary embodiment of the invention applied to an electrical interface between a power source and a circuit board, and in particular, a connection between a backplane and a buss bar. Of course, the invention can also be used in other applications, for example, in electrically coupling two printed circuit boards together.

Figure 1:
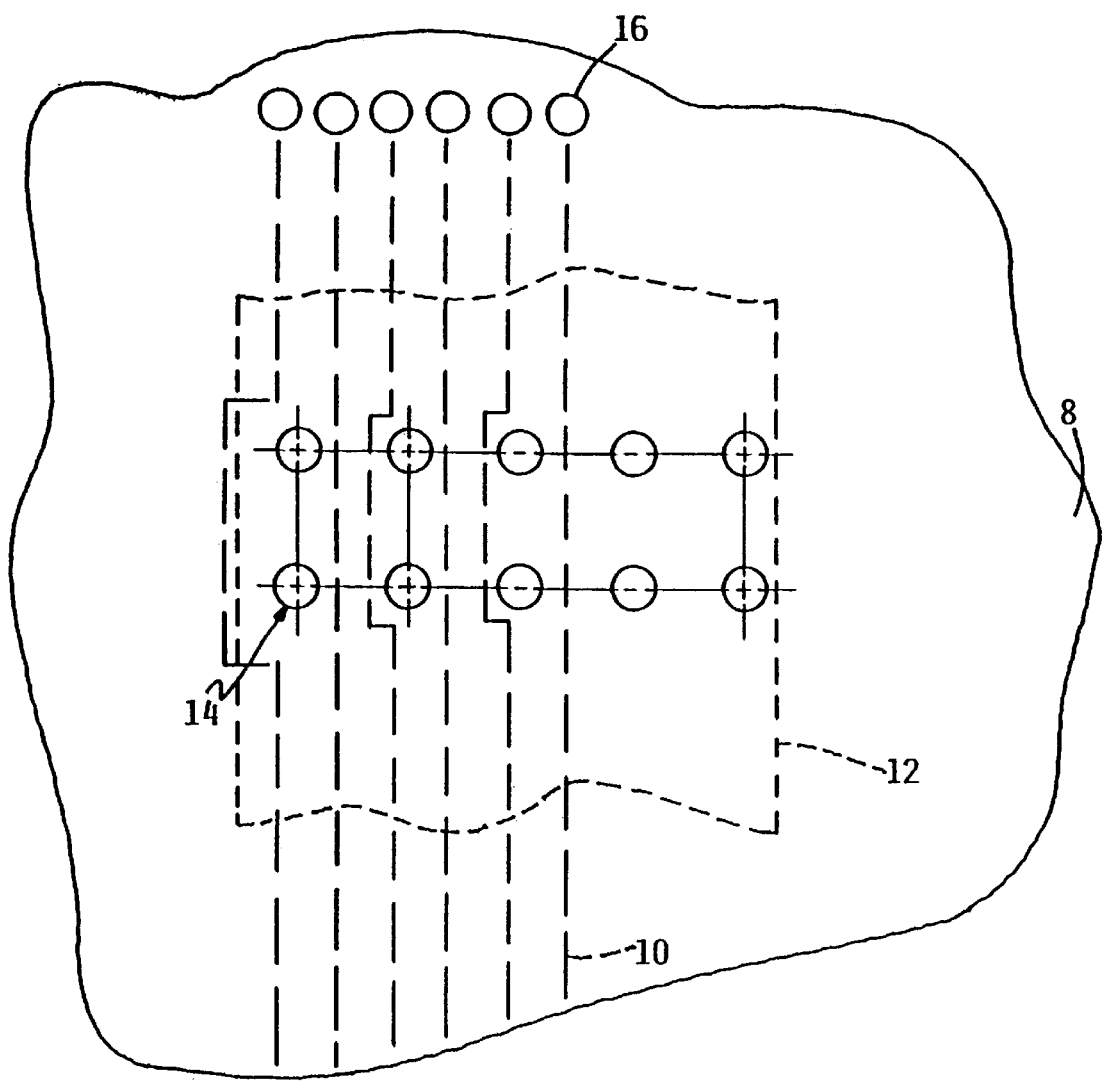
FIG. 1 is a partial, plan illustration of a conventional backplane, showing the conductive wirings and power plane in hidden lines.
Figure 2:
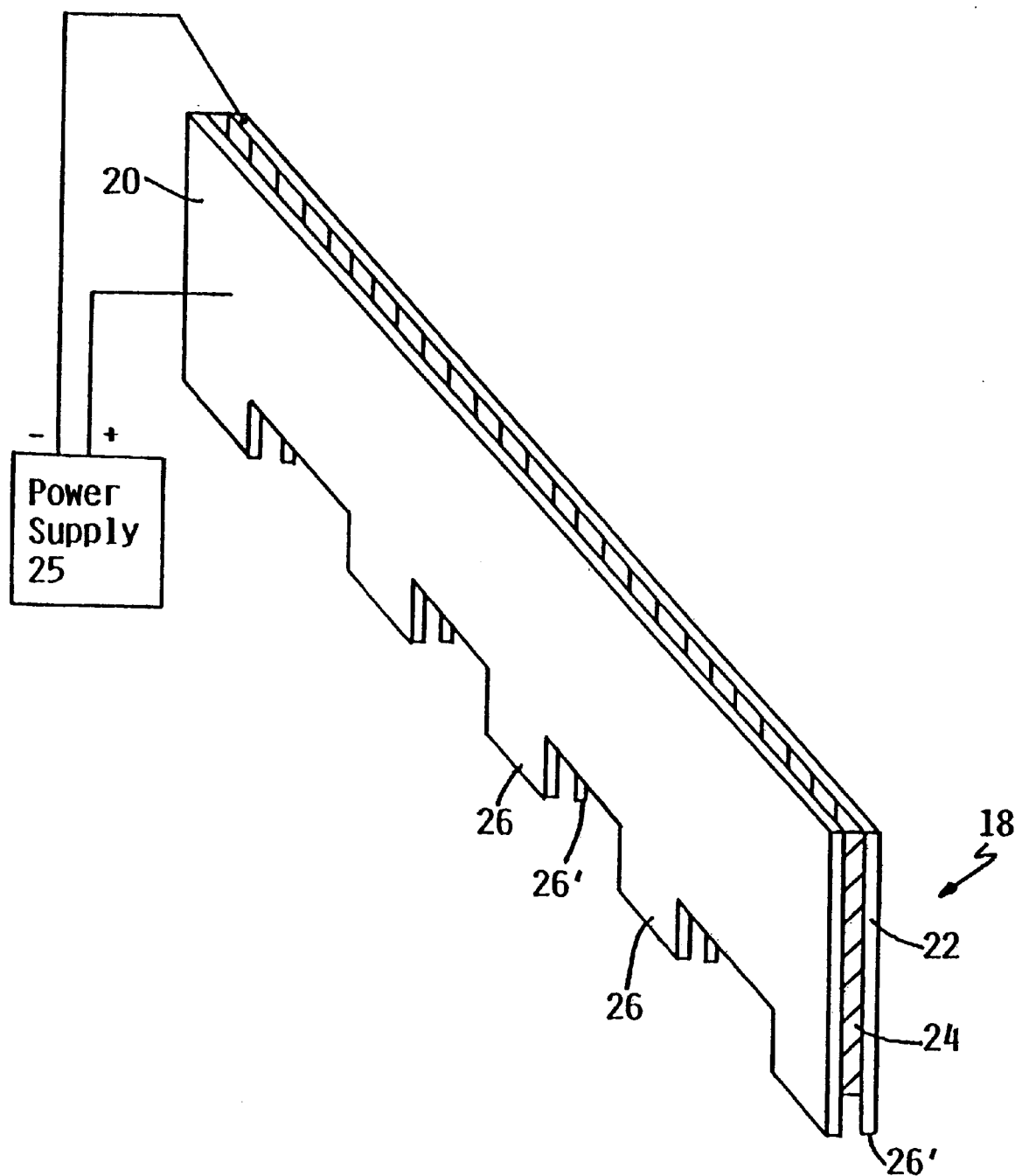
FIG. 2 is a perspective illustration of a conventional buss bar.
Figure 3:
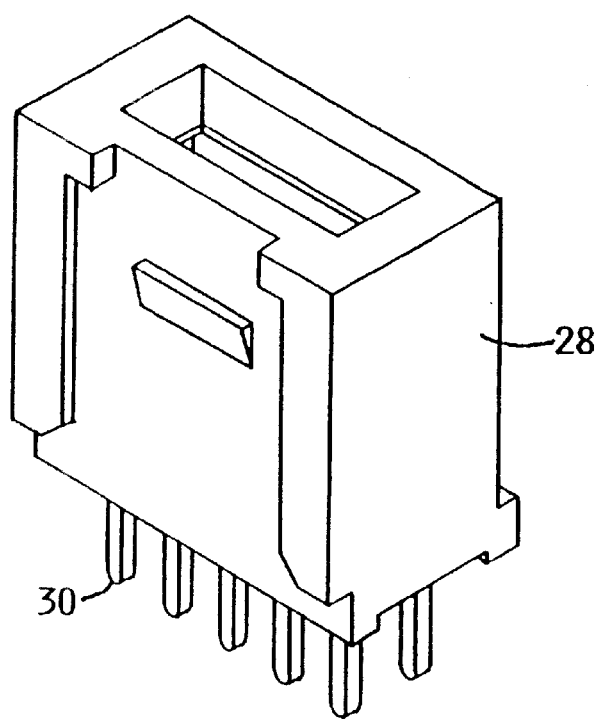
FIG. 3 is a perspective view of a conventional power receptacle, used to interconnect the backplane of FIG. 1 with the buss bar of FIG. 2.
Figure 4:
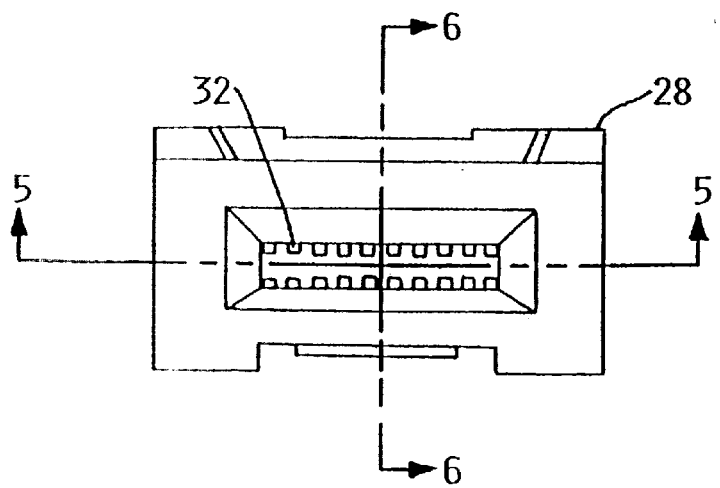
FIG. 4 is a plan view of the power receptacle shown in FIG. 3.
Figure 5:
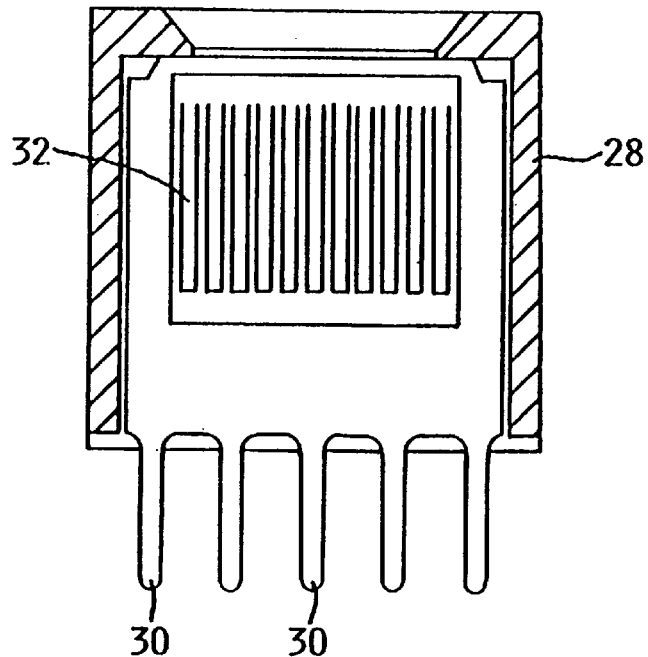
FIG. 5 is a sectional view of the power receptacle, taken along the section line 5—5 in FIG. 4.
Figure 6:
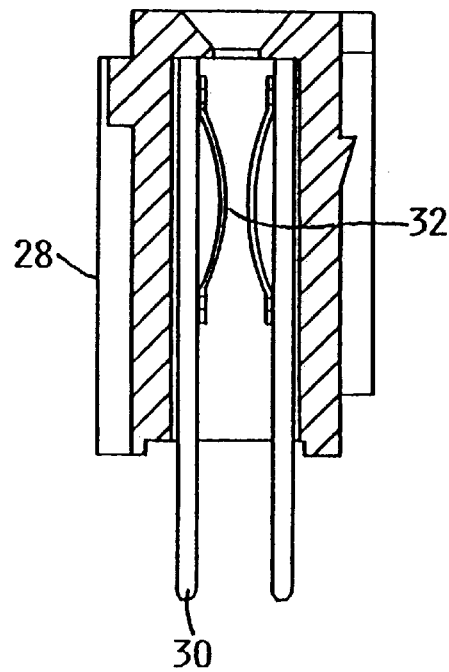
FIG. 6 is a sectional view of the power receptacle, taken along the section line 6—6 in FIG. 4.

In particular, the present invention is directed toward an electrical interface that includes a buss bar 40. The buss bar 40 according to an exemplary embodiment of the present invention includes two conductive layers 42, 44, separated from each other by a dielectric layer 46. These layers serve a similar purpose to their conventional counterparts, i.e., the layers 20, 22, 24 of the conventional buss bar 18 previously described, and illustrated in FIG. 2. Layer 42 is connected to a power supply 48. Layer 44 serves as a ground for a backplane 50 and is usually connected to an external (system) ground potential.

As shown, buss bar 40 has a generally rectangular shape (as viewed from its side) defined in part by its upper and lower longitudinal edges 51. However, the buss bar 40 according to the present invention is not limited to a rectangular configuration, and can have other shapes, without departing from the spirit and scope of the present invention.

Figure 8:
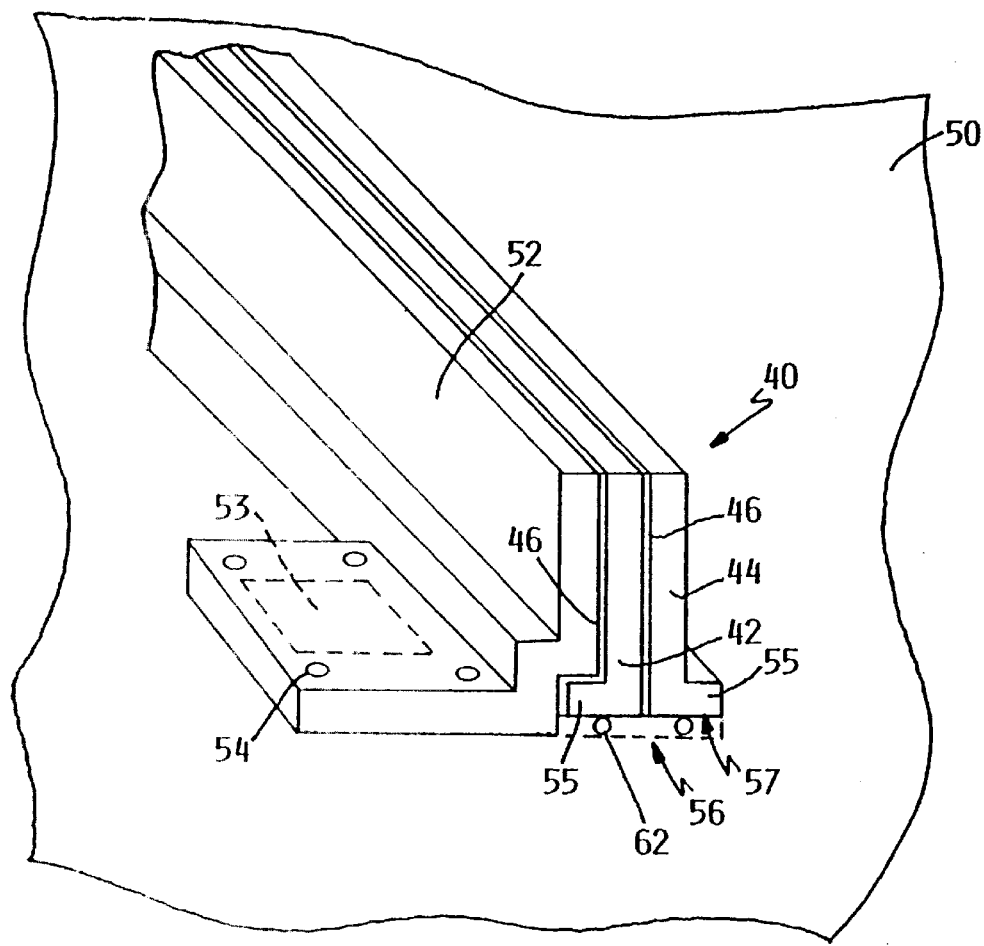
FIG. 8 is a partial perspective view of an alternative exemplary embodiment of the present invention.

Further, the buss bar 40 is not limited to only two conductive layers. Instead, and as shown in FIG. 8, the buss bar 40 may have three or more conductive layers 42, 44 and 52, separated from each other using a respective dielectric layer 46. The additional conductive layer 52 can advantageously be used to supply current to a discrete portion of the backplane 50. For example, the backplane 50 may be provided with a module 53 that requires a different voltage than that supplied by the conductive layer 42. The additional conductive layer 52 could be connected directly to the module 53, or to a wiring pad coupled to the module, for example, to provide the module with the necessary voltage. Further, the additional conductive layer 52 could be provided with a flange 54 that projects over and parallel to a surface of the backplane 50. The flange 54 is preferably sized and positioned so that when the buss bar 40 is in place, the flange is in direct contact with the module or wiring pad, for example.

Further, in the illustrated exemplary embodiment, each conductive layer 42, 44 is provided with a flange 55. The flanges 55 may be used to increase the foot-print of the buss bar 40. For example, if the dielectric layer 46 separating the conductive layers 42 and 44 is made relatively thin, for example, 0.005 inches thick, then a size of a base 56 of the buss bar 40 will be defined mainly by the collective size of the bases 57 of the conductive layers 42 and 44. By providing flanges 55, the buss bar 40 will have added stability, and be provided with a larger conductive surface area. A thin dielectric layer will allow for low inductance and high capacitance transmission line effects.

Preferably, the base 57 of the conductive layers 42 and 44 of the buss bar 40 will be substantially smooth and free of conductive projecting plugs, i.e., tabs. As used herein, the term "tab" connotes a tab that is plugged into a corresponding receptacle for the transmission of power. By eliminating conductive projecting tabs, the resulting arrangement will allow for a relatively high power transfer and with a reduced voltage drop, as compared to the conventional buss bar and power receptacle arrangement.

Referring back to FIG. 7, and according to an exemplary embodiment of the present invention, the buss bar 40 will be provided with at least one, and preferably two conductive channel members 58 provided in a region of its lower longitudinal edge 51. In the illustrated exemplary embodiment, the buss bar 40 is provided with two opposing channel members 58, each being conductively coupled to a respective conductive layer 42, 44, of the buss bar 40. The channel members 58 have an essentially inverted U-shaped cross-sectional profile that defines a channel that receives a conductive member, such as a coil spring 62, which will be further described in the paragraphs that follow. In order to retain the spring 62 within a respective channel, each channel member 58 will preferably have an internal width that is less than an outer diameter of the respective spring 62 (or other conductive member, as will be subsequently described). When the spring 62 is received within the respective channel member 58, the spring 62 will be retained therein in an interference type fit, i.e., so that the sides of the spring 62 are slightly compressed when received within the channel. This arrangement will advantageously ensure that a portion of a side of the spring 62 will bulge out of an open side of the channel member 58. Thus, when the buss bar 40 is positioned over and fastened to a circuit board, such as the illustrated backplane 50, the bulging portion of the spring 62 will be pressed against and contact the backplane 50 along the entire length of the spring. Further, this arrangement ensures that the spring 62 will be positioned correctly relative to the buss bar 40, and allows the spring to be connected to the buss bar 40 in a replaceable manner.

The buss bar 40 can be fastened to the backplane 50 by fastening the flanges 64, which are attached to the channel members 58, for example, to the backplane 50 using, for example, screws (not shown). Alternatively, if the buss bar 40 is not provided with channel members, the flanges 64 can be relocated to other portions of the buss bar 40. Further, it is also contemplated that the buss bar 40 can be held in position against the backplane 50 using other means, such as a clamping mechanism (not shown) that may be fastened to the backplane 50 and extend over the buss bar 40 to hold the buss bar 40 in place. Alternatively, the buss bar 40 can be held in location using a spring retaining device, which will be subsequently described in the paragraphs that follow.

The conductive coil spring 62 replaces the conventional Power receptacles, and advantageously results in a large number of A-spots at the interface between the buss bar 40 and the coil spring 62, thus allowing current to pass from the buss bar 40 to the coil spring 62 in an unrestricted manner. Further, the spring 62 has, for example, at least about 40 coils per inch, and preferably has between about 60 coils to about 70 coils per inch. It is believed that this range of coils will provide for a sufficient number of A-spots, while still providing a spring that can be manufactured using conventional techniques, that can tolerate the current flowing therethrough, and that has sufficient strength to resist permanent distortion.

The coil spring 62 may be positioned adjacent to the lower longitudinal edge 51 of the buss bar 40 along substantially an entire length of the buss bar 40, for example, within a respective channel member 58 in the manner previously described, so as to be electrically coupled to the buss bar 40. Due to the relatively large number of coils per inch of the spring 62, and because the spring extends along an entire length of the buss bar 40, the current will advantageously flow to the spring 62 from the buss bar 40 in a relatively uniform manner, i.e., without a substantial voltage drop across the length of the spring.

Figure 9:
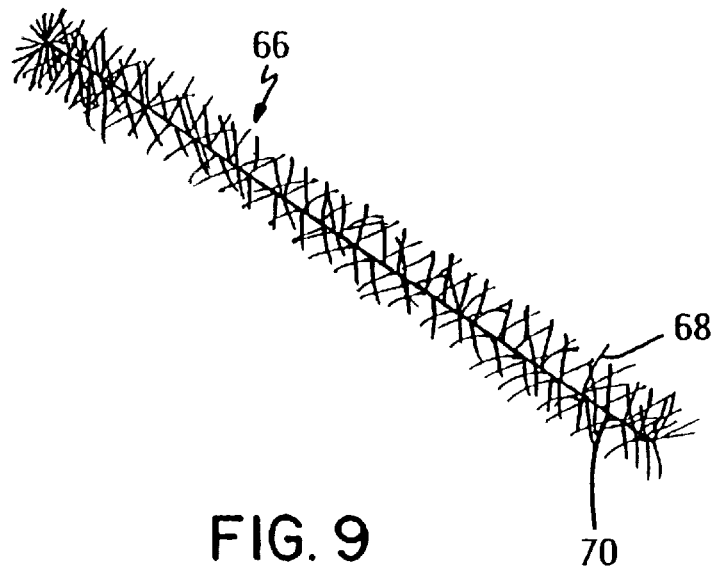
FIG. 9 is a perspective view of an alternative exemplary embodiment of a conductive member, according to the present invention.

The present invention, however, is not limited to the use of a coil spring, which is only being described by way of example. Instead, any configuration that will provide for at least about 40 A-spots per inch along substantially an entire length of a buss bar may be used. For example, the coil spring 62 can be replaced with the member 66 shown in FIG. 9, which has the shape of a bottle brush. This member 66 includes a large number of resilient conductive wires 68 that project radially outward from an axially-arranged member 70, which can likewise be a conductive wire. The conductive wires 68 can serve the same purpose as the coils of the spring 62, that is, provide a large number of A-spots per inch when placed against a surface.

According to an exemplary embodiment of the present invention, and referring back to FIG. 7, two springs 62 (or other conductive members, such as member 66), are provided and arranged parallel to, and separated from, each other. This arrangement allows each conductive layer 42 and 44 to be in electrical contact with a respective spring 62, while electrically isolating the springs from each other. For example, the base 56 of the buss bar 40 may be located between the springs 62. For instance, if the buss bar 40 is provided with channel members 58, then when the springs 62 are positioned within the channel members 58, the base 56 of the buss bar 40 will separate the springs from each other. If the buss bar 40 is not provided with channel members 58, then the springs 62 can be fastened directly to a surface of the backplane 50, with a space therebetween. The base 56 of the buss bar 40 can then be placed within the space between the two springs 62. Alternatively, and as best shown in FIG. 10, according to an exemplary embodiment of the present invention, a spring retaining device 72 can be provided. The spring retaining device 72 is formed of an insulating material, and is adapted to retain the springs 62 in a desired position, for example, between the base 56 of the buss bar 40 and the surface of the backplane (not shown in this Figure).

Preferably, the spring retaining device 72 has a profile that corresponds essentially to a profile of the base 56 of the buss bar 40. In this exemplary embodiment, the spring retaining device has a rectangular profile. Two parallel elongated through openings 74 are formed along a length of the spring retaining device 72. Each opening 74 has a length that corresponds essentially to a length of a respective spring 62, for example, and spaced apart from each other by essentially a width of the dielectric layer 46, i.e., each opening 74 is configured to be in registration with a corresponding conductive layer 42, 44, of the buss bar 40.

Preferably, the spring retaining device 72 will have a thickness that is less that a diameter of the respective springs 62, so that when the springs are positioned within the respective openings 74, opposing sides of the respective springs will project out of the openings. Thus, when the spring retaining device 72 is positioned between the base 56 of the buss bar 40 and the surface of the backplane, the springs 62 will make contact with the respective conductive layers 42, 44, and the surface of the backplane.

The spring retaining device 72 may be provided with retaining tabs 76 which project out over the respective openings 74. The retaining tabs 76 advantageously hold the springs 62 in place until the spring retaining device 72 is properly positioned between the base 56 of the buss bar 40 and the surface of the backplane. Moreover, the spring retaining device 72 may be provided with a locating tab 78 on one or both of its respective ends, which engages with a respective end of the buss bar 40, to prevent the buss bar 40 from sliding in a longitudinal direction.

The spring retaining device 72 may also be adapted to be attached directly to the buss bar 40 and/or the backplane 50. For example, in the exemplary embodiment, the spring retaining device 72 is provided with a plurality of arms 80 along its outer peripheral edge that project perpendicular to its major surface, and are arranged to be parallel and adjacent to the major surfaces of the respective conductive layers 42, 44. The free end of each respective arm 80 can be provided with a hook 82, that engages with the buss bar 40 to hold the spring retaining device 72 against the base 56 of the buss bar 40. In the illustrated embodiment, the hooks 82 engage with the upper edge of the buss bar 40. However, the hooks 82 and arms 80 could instead be adapted to engage with an upper surface of the respective channel members 58 shown in FIG. 7, or an upper surface of the respective flanges 55 shown in FIG. 8, if the buss bar 40 is so provided.

Additionally, the spring retaining device 72 may be fastenable to the backplane 50 using, for example, screws (not shown). When used in conjunction with the arms 80 and hooks 82, this would provide for a convenient and easy way to attach the buss bar 40 to the backplane.

Preferably, and referring back to FIG. 7, the spring 62 is electrically coupled to the backplane 50 along the entire length of the spring 62, so as to cause the backplane 50 and the buss bar 40 to be in electrical communication. This will result in an arrangement that will dramatically increase the number of A-spots at the connection between the buss bar 40 and the backplane 50, without increasing the complexity of assembly. Further, since Power receptacles are not needed, this arrangement will allow current to enter the backplane 50 in a more uniform manner. Additionally, because this arrangement eliminates the need for the buss bar 40 to be plugged into a receptacle, insertion forces are eliminated (or at least significantly reduced), which will facilitate assembly, and prevent damage to the associated backplane 50.

Figure 11:
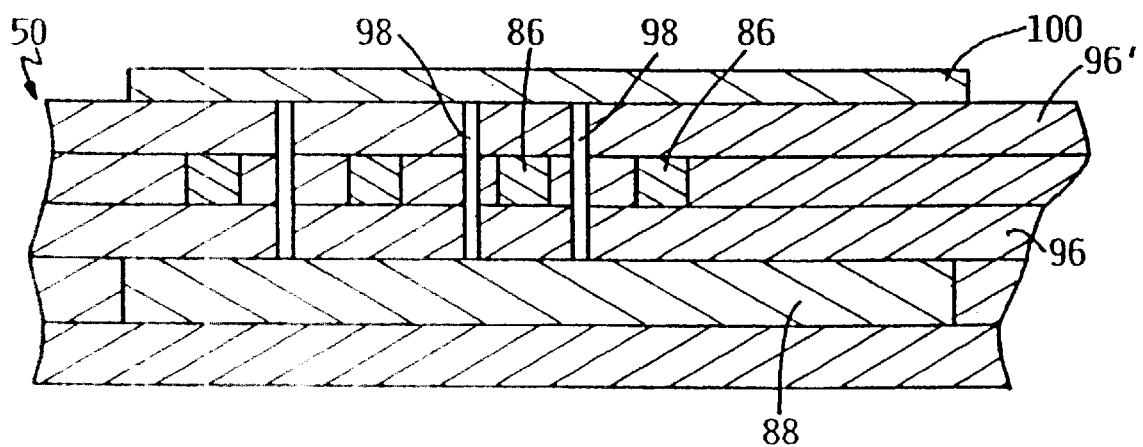
FIG. 11 is a cross-sectional view of a circuit board, according to an exemplary embodiment of the present invention.
Figure 12:
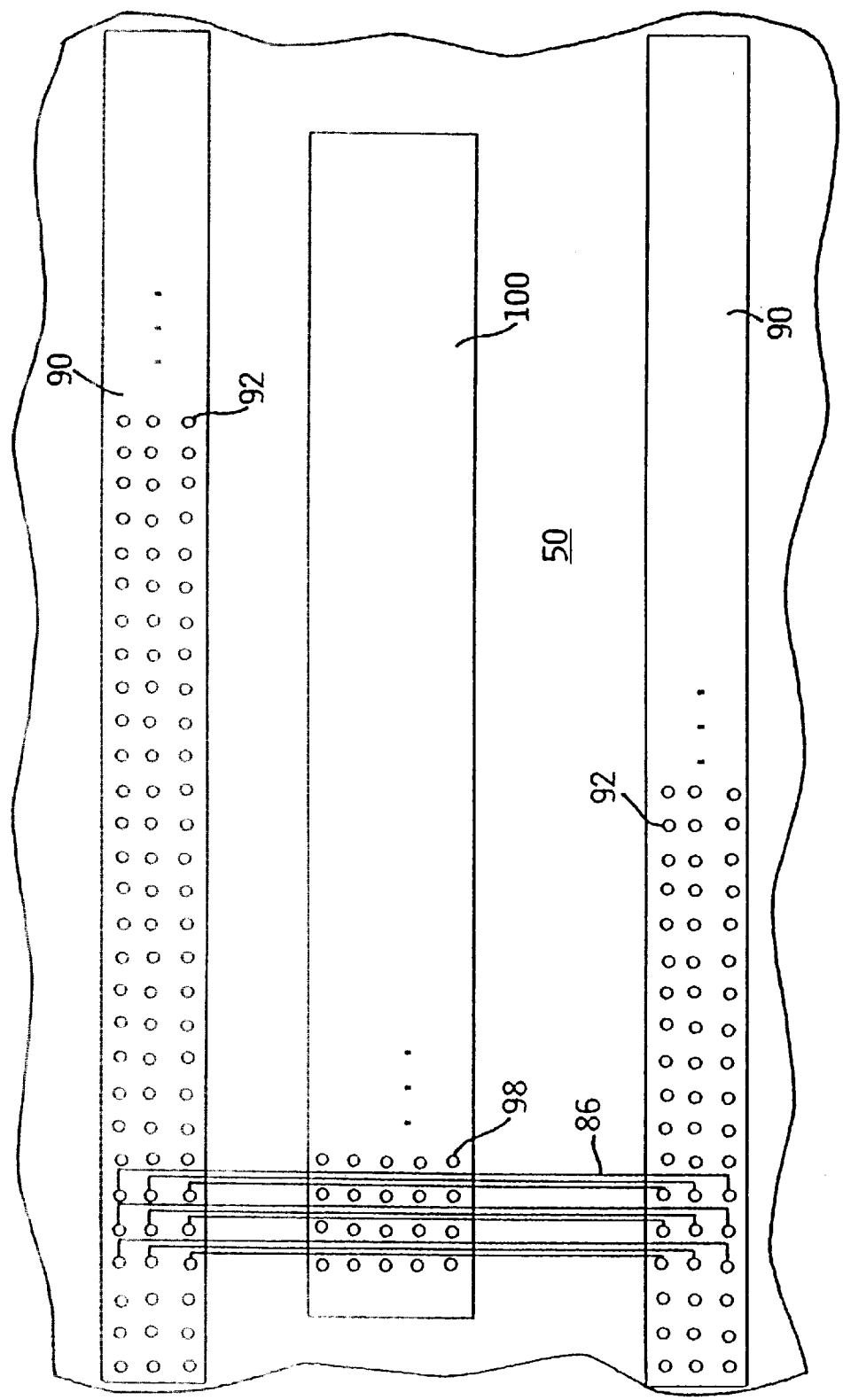
FIG. 12 is a plan view of various internal components of the circuit board shown in FIG. 11.

Referring also to FIGS. 11 and 12, and according to an exemplary embodiment of the present invention, the backplane 50 is preferably provided with a plurality of internal planes. Each internal plane is specifically tailored to allow the transmission of power or electrical signals, for example. As shown in FIG. 11, the backplane 50 is provided with one internal wiring plane comprised of a plurality of wirings 86, and one internal power plane 88 comprised of a sheet of conductive material. In the illustrated embodiment, only two internal planes are shown, with the wirings 86 of the wiring plane being located over the internal power plane 88. However, the present invention is not limited to two internal planes, or the configuration shown. Other configurations with additional internal planes are contemplated within the scope of the invention. Moreover, although the exemplary embodiment is directed toward a backplane 50, the present invention is also applicable to other types of circuit boards.

As shown best in FIG. 12, wirings 86 are arranged to extend parallel to each other, and separated from each other by a space, and are used to interconnect two connector pin fields 90 together. The connector pin fields 90 are arrangements of vias 92 in the backplane 50 (i.e., holes that are plated or filled with a conductive material). Select ones of the vias 92 are connected to a respective wiring 86, which allows for an electrical component or printed circuit board, such as a clock card or a processor board, to be coupled to the backplane 50.

Further, and referring back to FIG. 11, the power plane 88 is positioned beneath, and separated from the wirings 86 by an insulating layer 96. The power plane 88 is used to convey current, in a known manner, to the associated printed circuit boards and electrical components connected to the backplane 50. The backplane 50 further includes a plurality of conductive vias 98 which are electrically coupled to the power plane 88, and which allow the power plane 88 to be electrically coupled with the spring 62, in a manner which will be subsequently described.

According to an exemplary embodiment of the present invention, the vias 98 are positioned to avoid wirings 86. This differs from the known arrangement, which required that the wirings 86 be positioned in dependence on a placement of the vias 98. For example, the vias 98 can be placed in a seemingly random pattern, such as in any free space separating the wirings 86. This arrangement will advantageously allow the conductive wirings 86 to be located without regard to the placement of the conductive vias 98, so that the conductive wirings 86 can be positioned in the most efficient manner. The conductive vias 98 can then be located in a variety of free locations, without interfering with the placement of the conductive wirings 86.

According to another exemplary embodiment of the present invention, and as best shown in FIG. 11, the backplane 50 will include a conductive pad 100 formed on a surface of the backplane 50, and separated from the wirings 86 by a further insulating layer 96'. Each via 98 passes through the insulating layers 96, 96', and electrically couples the conductive pad 100 to the power plane 88. This arrangement will provide a relatively large surface to which the spring 62 can be electrically coupled to. Further, the conductive pad 100 can be connected to the conductive vias 98, even if the vias 98 are located over a relatively large area, and in a seemingly random pattern. In the exemplary embodiment, the conductive pad 100 is formed from gold, but it may also be composed of other conductive materials.

If the buss bar 40 is not provided with channel members 58, and if a spring retaining device 72 is not provided, then the springs can be fastened directly to the conductive pad 100. For example, the springs 62 can be spot soldered at various locations along their entire lengths to the conductive pad 100, so that each coil of each spring 62 is fastened in an electrically conductive manner to the pad 100.

Figure 13:
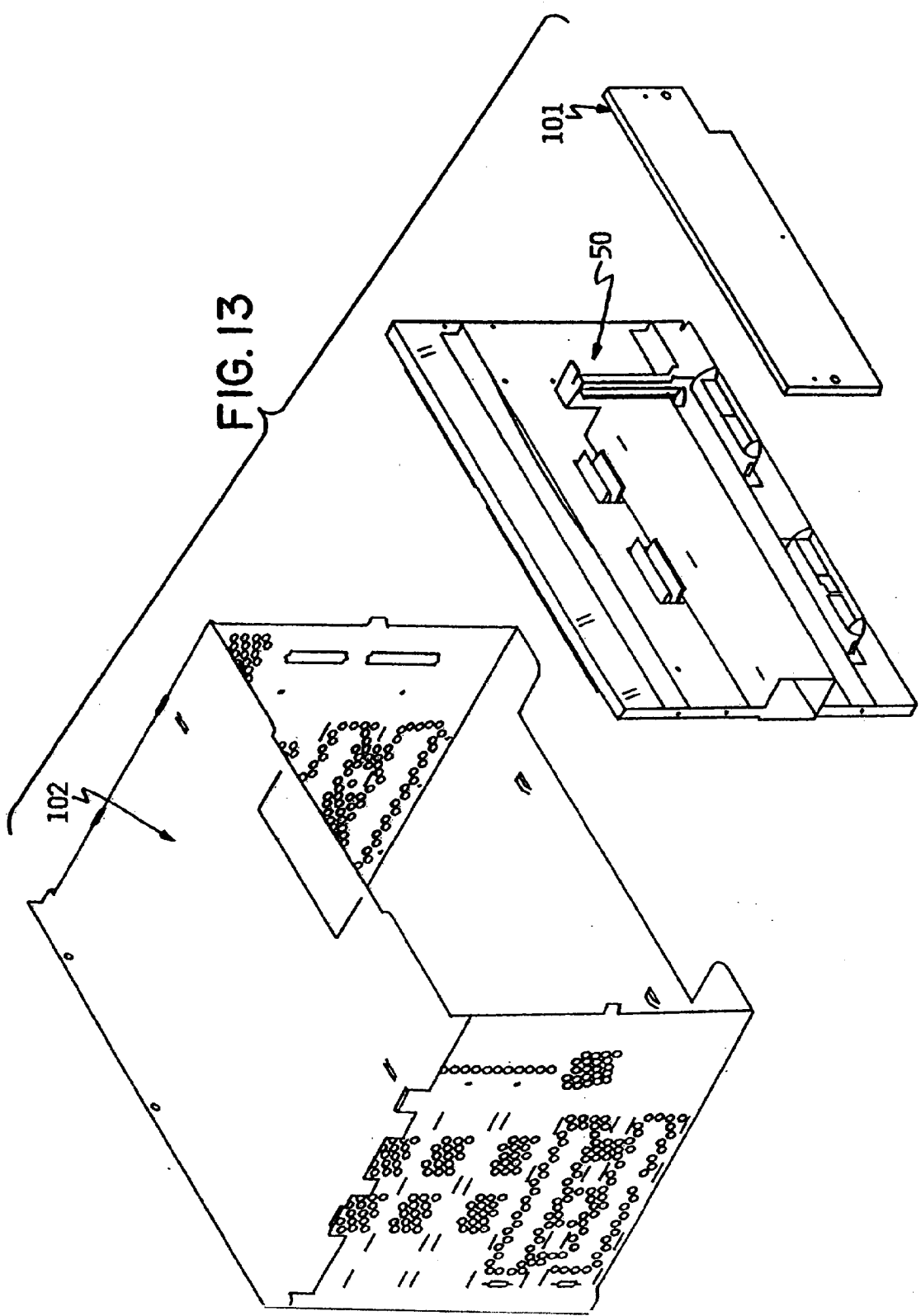
FIG. 13 is an exploded perspective view of a cage, backplane and associated circuit card, according to an exemplary embodiment of the present invention.
Figure 14:
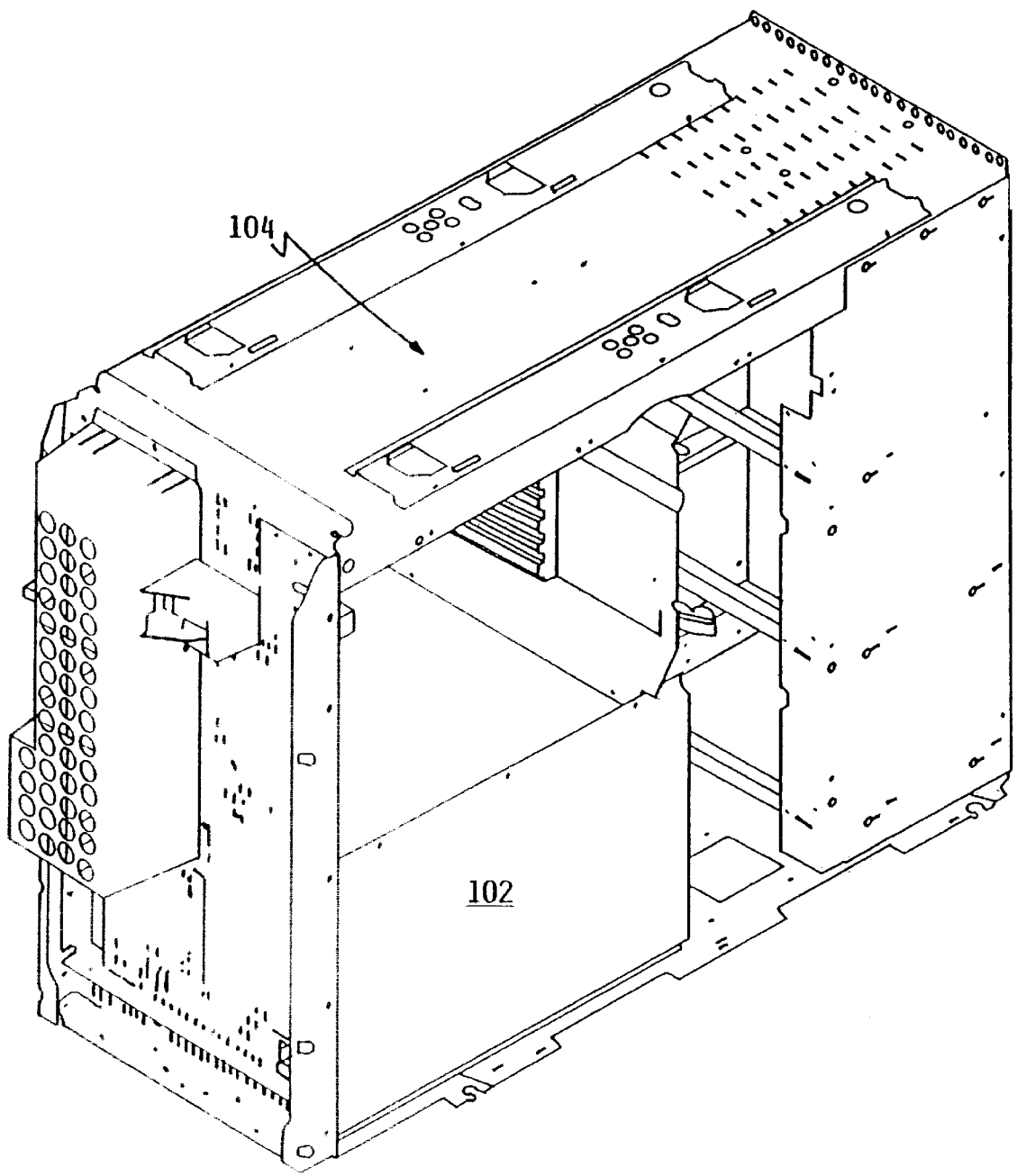
FIG. 14 is a perspective view showing the cage of FIG. 13 positioned within a computer housing.

As shown in FIGS. 13 and 14, the assembly of the backplane 50 and circuit boards attached thereto, such as a clock card 101, may be positioned within a cage 102, to facilitate placement within a computer housing 104.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. An electrical interface arrangement, comprising:
    a buss bar;
    a circuit board; and
    at least one elongated conductive member conductively coupling said buss bar to said circuit board by contacting both said buss bar and said circuit board with a plurality of electrical connection points per inch, wherein said conductive member comprises at least one conductive coil spring having at least about 40 coils per inch, and being positionable adjacent to a lower longitudinal edge of said buss bar along substantially the entire length of said buss bar, so as to be electrically coupled to said buss bar; and wherein said buss bar has at least one conductive, longitudinally arranged channel provided in a region of the lower longitudinal edge, said channel having a width, and an open side facing said circuit board; said coil spring having an outer diameter that is greater than the width of the channel, and being positionable within the channel so that a portion of a side of the spring bulges into contact with said circuit board.

2. The electrical interface arrangement of claim 1, wherein said buss bar is free of conductive projecting plugs.

3. The electrical interface arrangement of claim 1, wherein said spring has between about 60 coils per inch and about 70 coils per inch.

4. The electrical interface arrangement of claim 1, wherein said at least one channel comprises two channels, and wherein said at least one coil spring comprises two coil springs arranged parallel to and separated from each other, and each being disposed in a respective channel, said buss bar being in contact with said coil springs in a region of the lower longitudinal edge.

5. The electrical interface arrangement of claim 1, wherein each of said coils of said spring is in contact with said buss bar at a respective electrical connection point.

6. The electrical interface arrangement of claim 1, wherein said conductive member conductively contacts said circuit board with about a same total number of electrical connection points as said conductive member contacts said buss bar, so as to cause said circuit board and said buss bar to be in electrical communication.

7. The electrical interface arrangement of claim 1, wherein said circuit board comprises a backplane having a plurality of internal planes, with at least one of said internal planes being an internal power plane, said conductive member being electrically coupled to said internal power plane.

8. The electrical interface arrangement of claim 7, wherein at least one of said internal planes comprises an internal wiring plane having a plurality of conductive wirings; said backplane further having means for electrically coupling said coil spring to said internal power plane without interfering with a placement of said conductive wirings.

9. The electrical interface arrangement of claim 8, wherein said means for electrically coupling comprises a plurality of conductive vias extending past, positioned to avoid, and in dependence on a predetermined location of, said conductive wirings.

10. A method of electrically connecting a buss bar to a backplane for providing power to the backplane, which comprises utilizing the electrical interface arrangement of claim 1.

11. The electrical interface arrangement of claim 1, wherein the channel is formed in a channel member having an essentially inverted, U-shaped outer peripheral profile.

12. An electrical interface arrangement, comprising:
a buss bar having a longitudinal edge that is substantially smooth and free of conductive projecting plugs; and
at least two conductive coil springs arranged parallel to, and separated from each other, the longitudinal edge of said buss bar being located adjacent to and between the respective springs so that the springs are positioned against said buss bar along substantially an entire length of said buss bar, with each of said coils of said springs being in contact with said buss bar, wherein when said at least two conductive coil springs are in contact with said buss bar, a portion of each of said coils of said at least two conductive coil springs will be free of direct contact with said buss bar, the respective portions facing in a same direction as the longitudinal edge faces.

13. The electrical interface arrangement of claim 12, wherein said buss bar has at least a first, second and third, conductive layer, each conductive layer being electrically insulated from the other conductive layers, said first and second conductive layers each being in electrical contact with a respective spring in a region of the longitudinal edge of said buss bar, and wherein said backplane has a conductive area, separate from said means for electrically connecting, on a surface thereof, said third conductive layer being in direct contact with the conductive area.

14. The electrical interface arrangement of claim 12, further comprising means for holding and positioning the conductive coil springs in contact with said buss bar.

15. The electrical interface arrangement of claim 14, wherein said means for holding and positioning includes:
an insulator plate positionable beneath a base of said buss bar, and having at least two elongated openings formed therethrough, each of said conductive coil springs being positionable within a respective opening; and
an arm connected to said insulator plate and being removably engagable with said buss bar to hold said insulator plate and said springs against the base of said buss bar.

16. The electrical interface arrangement of claim 1, wherein said at least one elongated conductive member is removably coupled to said buss bar.

17. The electrical interface arrangement of claim 12, further comprising a backplane having a plurality of internal planes, with at least one of said internal planes being an internal power plane, and with at least another one of said internal planes being an internal wiring plane having a plurality of conductive wirings, said backplane further having means for electrically connecting each of said springs to said internal power plane without interfering with a placement of any of said conductive wirings, so that said backplane and said buss bar are in electrical communication.

18. The electrical interface arrangement of claim 17, wherein said means comprises:
a plurality of conductive vias electrically coupled to said internal power plane and being positioned to avoid, and in dependence on a predetermined location of, said conductive wirings; and
a conductive pad formed on a surface of said backplane, and being electrically coupled to said conductive vias, said springs being positionable on said conductive pad to electrically connect said buss bar to said internal power plane.

19. The electrical interface arrangement of claim 18, wherein said buss bar has at least two conductive channels, each being provided on a respective side of said buss bar in a region of its longitudinal edge, each of said channels having a width, and an open side; each of said coil springs having an outer diameter that is greater than the width of the channels, and being positionable within a respective channel so that a side of the respective spring is forced through the open side of said channel and in contact with said conductive pad.

20. A computer, comprising:
a computer housing;

a power supply located within said computer housing;

a buss bar coupled to said power supply, and having a longitudinal edge that is substantially smooth and free of conductive tabs;

at least two conductive coil springs arranged parallel to, and separated from each other, the longitudinal edge of said buss bar being positionable adjacent to said coil springs so that the respective springs are located against said buss bar along substantially an entire length of said buss bar, with each of said coils of said springs being in contact with said buss bar;

a backplane located within said computer housing, and having a plurality of internal planes, with at least one of said internal planes being an internal power plane, and with at least another one of said internal planes being an internal wiring plane having a plurality of conductive wirings, said backplane further having means for electrically connecting each of said springs to said internal power plane without interfering with a placement of any of said conductive wirings, so that said backplane and said buss bar are in electrical communication; and at least one circuit board attached to said backplane and being coupled to said conductive wirings.

21. An electrical interface arrangement, comprising:

a buss bar having a laterally-projecting base, and a first width at a location above the base, and a second width at the base that is greater than the first width so that the base of said buss bar has a footprint that is greater in area than a footprint defined by the buss bar without the base;

a circuit board; and at least two conductive coil springs arranged parallel to, and separated from each other and conductively coupling said buss bar to said circuit board by contacting both said buss bar and said circuit board with a plurality of electrical connection points per inch, wherein said conductive coil springs conductively contact said buss bar along substantially an entire length of said buss bar and at the base of said buss bar;

wherein a longitudinal edge of said buss bar is located adjacent to and between the respective springs so that the springs are positioned against said buss bar along substantially the entire length of said buss bar, with each of said coils of said springs being in contact with said buss bar;

and wherein when said at least two conductive coil springs are in contact with said buss bar, a portion of each of said coils of said at least two conductive coil springs will be free of direct contact with said buss bar, the respective portions facing in a same direction as the longitudinal edge faces.

22. An electrical interface arrangement, comprising:

a buss bar;

a circuit board; and at least one elongated conductive member conductively coupling said buss bar to said circuit board by contacting both said buss bar and said circuit board with a plurality of electrical connection points per inch, wherein said buss bar has at least one conductive channel member for receiving said at least one elongated conductive member therein; and wherein said channel member provides said buss bar with a base having a footprint that is greater in area than a footprint defined by the bussbar without the channel member.

23. The electrical interface arrangement of claim 22, wherein said buss bar has a lower longitudinal edge, the at least one channel member being disposed adjacent to the lower longitudinal edge, the conductive member being disposed within said channel member.

24. The electrical interface arrangement of claim 22, wherein said channel member has an essentially inverted, U-shaped outer peripheral profile.

\* \* \* \* \*